United States Patent [19]

Giordano

[11] Patent Number: 4,695,744
[45] Date of Patent: Sep. 22, 1987

[54] LEVEL SHIFT CIRCUIT INCLUDING SOURCE FOLLOWER OUTPUT

[75] Inventor: Raymond L. Giordano, Raritan Township, Hunterdon County, N.J.

[73] Assignee: RCA Corporation, Somerville, N.J.

[21] Appl. No.: 809,132

[22] Filed: Dec. 16, 1985

[51] Int. Cl.$^4$ .................... H03K 3/26; H03K 17/687; G01R 19/00
[52] U.S. Cl. .................... 307/279; 307/530; 307/585; 307/264; 307/475
[58] Field of Search .................... 307/475, 264, 247 R, 307/279, 585, 451, 448, 530

[56] References Cited

U.S. PATENT DOCUMENTS

| | | | |
|---|---|---|---|
| 3,651,342 | 3/1972 | Dingwall | 307/585 |
| 3,676,700 | 7/1972 | Buchanan | 307/205 |
| 3,728,556 | 4/1973 | Arnell | 307/251 |
| 3,801,831 | 4/1974 | Dame | 307/251 |
| 3,916,430 | 10/1975 | Heuner et al. | 357/42 |
| 3,942,043 | 3/1976 | Sirocka | 307/279 |
| 4,039,862 | 8/1977 | Dingwall et al. | 307/247 R |
| 4,080,539 | 3/1978 | Stewart | 307/264 |
| 4,295,065 | 10/1981 | Hsieh et al. | 307/475 |
| 4,318,015 | 3/1982 | Schade | 307/475 |
| 4,321,491 | 3/1982 | Atherton et al. | 307/475 |
| 4,450,371 | 5/1984 | Bismarck | 307/475 |
| 4,486,670 | 12/1984 | Chan et al. | 307/264 |
| 4,501,978 | 2/1985 | Gentile et al. | 307/475 |
| 4,532,436 | 7/1985 | Bismarck | 307/279 |

OTHER PUBLICATIONS

Patent Application of Dora Plus, Ser. No. 674,845 (RCA 80,702), entitled High-Speed Voltage Level Shift Circuit, filed 11/26/84.

*Primary Examiner*—Stanley D. Miller
*Assistant Examiner*—Trong Quang Phan
*Attorney, Agent, or Firm*—S. C. Corwin; B. E. Morris; H. I. Schanzer

[57] ABSTRACT

Each one of two switching transistors, driven by complementary input signals, has its conduction path connected between a different one of two output terminals and a first point of potential. Connected between each output terminal and a second point of potential are the conduction paths of a load transistor responsive to the signal at the other output terminal. A source follower transistor is connected to each output terminal. When the switching transistor connected to one output terminal is being turned-OFF, the source follower connected to that output terminal is turned-ON to enhance the voltage response at that terminal and to thereby accelerate the speed of response of the circuit and minimize its power dissipation.

9 Claims, 3 Drawing Figures

LEVEL SHIFT CIRCUIT INCLUDING SOURCE FOLLOWER OUTPUT

This invention relates to switching circuits which are particularly useful in level shift applications.

It is often necessary and/or desirable to operate different parts of an electronic system at different voltage levels. At the places where the different parts interface, they must be coupled to each other. However, the signals at the interfaces are not necessarily compatible. It is, therefore, often necessary to provide interface and level shift circuits which can render one part of the system compatible with the other.

For an interface or level shift circuit to be useful, it must be compatible with the other circuits of the system with respect, among others, to speed of operation, and minimization of power dissipation.

The invention is best understood and explained with reference to the prior art level shift circuit shown in FIG. 1. In FIG. 1 and in the accompanying drawings like reference characters denote like components, and insulated-gate field-effect transistors (IGFETs) of P-conductivity type are identified by the letter P followed by a reference numeral, and IGFETs of N-conductivity type are identified by the letter N followed by a reference numeral.

FIG. 1 includes an input inverter I1 operated between a first potential of $V_{CC}$ and ground. In response to an input signal A applied to its input, inverter I1 produces a signal $\overline{A}$. The complementary signals A and $\overline{A}$ are applied to the gates of transistors N1 and N2 which are the inputs of the two level shift inverters comprised of transistors N1, P1 and N2, P2. The sources of transistors N1 and N2 are connected to ground conductor 16. Cross-coupled transistors P1 and P2, which function as the load devices of the level shift inverters, have their conduction paths connected between a conductor 18 to which is applied a potential of $V_{DD}$ volts. The drains of transistors P1 and N1 are connected to an output node 1 at which is produced output $\overline{Q}$, and the drains of transistors P2 and N2 are connected to an output node 2 at which is produced output Q. The gate of transistor P1 is connected to the Q output and the gate of transistor P2 is connected to the $\overline{Q}$ output.

The potential $V_{DD}$ may be, typically, in the range of 5 to 15 volts. In response to input signals A and $\overline{A}$ which vary between $V_{CC}$ volts and ground, output signals are produced at Q and $\overline{Q}$ which vary between $V_{DD}$ and ground.

The prior art circuit of FIG. 1 has many desirable features, but dissipates a relatively large amount of power during its relatively slow transition from one state to another, as detailed below. Assume that A, which was initially at $V_{CC}$ volts (high), goes to ground and, that $\overline{A}$ goes from ground to $V_{CC}$ volts. $\overline{A}$ being high causes N1 to be turned-ON, and A being low causes N2 to be turned-OFF. However, the $\overline{Q}$ and Q outputs which were at $V_{DD}$ and ground, respectively, do not go immediately to ground and $V_{DD}$, respectively. When N1 turns-ON, transistor P1 is still turned-ON and conducting. To guarantee switching of the level shift inverters, the ON impedance of each P-type transistor is made greater than the ON impedance of its associated N-type transistor for the same bias conditions. This ensures that when transistor N1 (N2) turns-ON, $\overline{Q}$ (Q) drops significantly below $V_{DD}/2$. However, the high ON impedances of the P-type transistors slow the rise time of Q and $\overline{Q}$. For example, when A goes from high-to-low and $\overline{A}$ goes from low-to-high, N2 is turned-OFF and N1 is turned-ON. However, $\overline{Q}$ does not immediately go to ground and Q does not immediately go to $V_{DD}$. When N2 turns-OFF, it no longer controls the voltage at output node 2. P2, which is intended to drive node 2 to $V_{DD}$, is not immediately fully turned-ON since its turn-ON is a function of $\overline{Q}$. Furthermore, P2 is a high impedance device and, even if P2 were fully turned-ON, it takes a relatively long time, to charge the capacitance at node 2 to $V_{DD}$ volts. Therefore, for some time after N1 is turned-ON and N2 is turned-OFF, P2 is not fully ON and P1 remains ON, which increases the time it takes for Q to go high and $\overline{Q}$ to go low. Also, when transistor P1 or P2 is ON during the relatively long transistion period, the current flowing through P1 or P2 is conducted through ON transistor N1 or N2 go ground. Therefore, power is dissipated during the transition period from one state to another.

Thus, a problem exists where a switching transistor (e.g., N1 or N2) has one end of its conduction path connected to a node (e.g., 1 or 2) and a relatively high impedance load (P1 or P2) is connected between the node and a point of operating potential. When the switching transistor is turned-OFF, the relatively high impedance load takes a relatively long time to charge-up (or discharge) the node. In circuits embodying the invention, the speed of response is increased by providing means for applying a voltage step to the node of a magnitude to enhance the voltage response at the node when the switching transistor is being turned-OFF.

Figure 1:
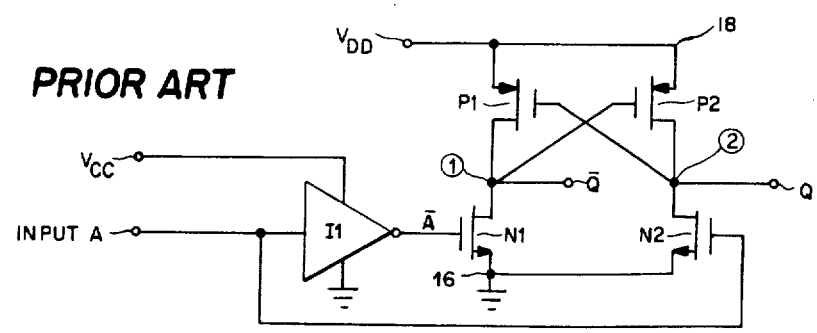
FIG. 1 is a schematic diagram of a prior art circuit.
Figure 2:
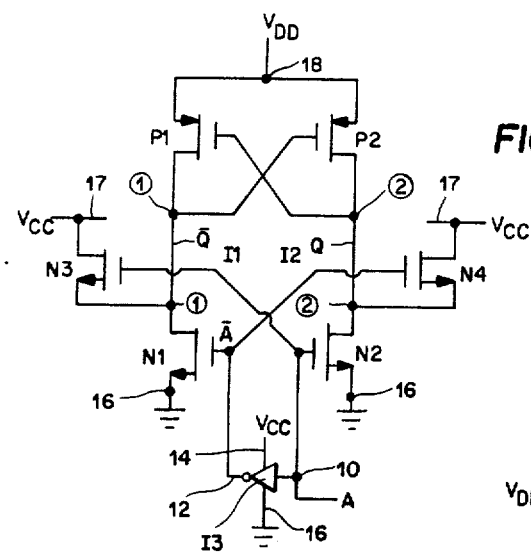
FIG. 2 is a schematic diagram of a level shift circuit embodying the invention.

The level shift circuit of FIG. 2 includes an IGFET, N1, whose conduction path is connected between an output node 1 and ground, and an IGFET, N2, whose conduction path is connected between an output node 2 and ground. A first load IGFET, P1, has its conduction path connected between output node 1 and a terminal 18 to which is applied a potential of $V_{DD}$ volts. A second lode IGFET, P2, has its conduction path connected between output node 2 and terminal 18. P1 and P2 are cross-coupled with the gate of P1 connected to node 2, and the gate of P2 connected to node 1. The interconnection of N1, P1, N2 and P2, which is similar to the prior art circuit of FIG. 1, is modified by the addition of pull-up IGFETs N3 and N4.

IGFET, N3, is connected at its source electrode to node 1 and at its drain electrode to a power terminal, 17, to which is applied a potential of $V_{CC}$ volts. IGFET, N4, is connected at its source electrode to node 2, and at its drain electrode to terminal 17. The gate electrode of N3 is connected in common with the gate of N2 to an input terminal 10 to which is applied an input signal (A). The gate electrode of N4 is connected in common with the gate of N1 to terminal 12 at which is produced a signal $\overline{A}$ which is the complement of A.

An inverter, I3, operated between $V_{CC}$ volts and ground is connected at its signal input to input terminal 10 and at its output terminal to terminal 12. Inverter 13 may be a complementary inverter comprised of an N-type transistor and a P-type transistor or it may be any one of a number of known inverting circuits. The signal A applied to the input of inverter 13 (and to the gates of N2 and N3) produces the complementary signal $\overline{A}$ at the output of 13.

In the discussion of the operation of the circuit to follow, it is assumed that $V_{CC}$ is less than $V_{DD}$, and that signals A and $\overline{A}$ are switched between ground $V_{CC}$.

The status of the circuit in the steady state condition will first be discussed. Assume, initially, that A is high ($V_{CC}$ volts) and, consequently, that $\overline{A}$ is low (ground). $\overline{A}$ being low causes transistor N1 to be turned-OFF and A being high causes N2 to be turned-ON. N1-OFF and N2-ON cause transistor P1 to be turned full ON, and P2 to be turned-OFF. Consequently, the Q output at node 2 is at, or close to, ground potential (Q is low). Q-low is applied to the gate of transistor P1 and keeps it fully turned-ON. Transistor P1 with its gate at zero volts, is fully turned-ON whereby its conduction path provides an impedance path between conductor 18 and output node 1, coupling the $V_{DD}$ volts at conductor 18 to the drain of transistor N1. Since transistor N1 is OFF, there is no conduction through its source-drain path. Therefore, transistor P1 clamps output node 1 to $V_{DD}$ volts and $\overline{Q}$ is high. Q-high, applied to the gate of transistor P2 turns-it-OFF. With transistor P2 turned-OFF, N2 which is turned-ON clamps output node 2 to ground.

During the steady state condition, N3 and N4 are turned-OFF and do not affect the operation of the circuit. For example, for the condition where A is at $V_{CC}$ and $\overline{Q}$ is at $V_{DD}$, $\overline{A}$ and Q are low (ground). N3 has $V_{CC}$ applied to its gate and drain/source electrodes and $V_{DD}$ applied to its source/drain electrode, and is non-conductive. N4 has $V_{CC}$ applied to its drain and zero volts applied to its gate and source and is OFF.

For the complementary input condition (A-low and $\overline{A}$-high), N1 is turned-ON and N2 is turned-OFF. N1-ON clamps output node 1 to ground ($\overline{Q}$ is low) which turns-ON P2 which clamps node 2 to $V_{DD}$ volts (Q is high) and maintains P1 turned-OFF. N3 and N4 are turned-off.

The response of the circuit to a transient condition, when the input signal changes levels, will now be discussed. Assume that the input signal A makes a transition from the high level ($V_{CC}$) condition to the low level (ground) condition. Consequently, $\overline{A}$ makes a transition from the low level (ground) condition to the high level ($V_{CC}$) condition.

As the $\overline{A}$ signal rises from ground towards $V_{CC}$ volts, it reaches a value equal to the threshold voltage ($V_T$) of transistor N1. Transistor N1 then turns-ON and the potential at $\overline{Q}$ starts to go from $V_{DD}$ volts toward zero volts. Concurrent with the turn-ON of N1, the positive going $\overline{A}$ signal applied to the gate of N4 turns-it-ON.

The role of N4 in hastening the transition at nodes 2 and 1 is now examined. As soon as the signal $\overline{A}$ rises above $V_T$ volts, N4 is turned-ON and conducts current into node 2. N4 conducts in the source follower mode and its low source impedance (characteristic of source follower action) ensures that the voltage at node 2 rises quickly and positively to a value equal to the gate voltage of N4 minus its threshold voltage $V_T$. When $\overline{A}$ reaches $V_{CC}$ volts, $V_{CC}$ is applied to the gate of N4 and N4 then drives the voltage at its source to [$V_{CC}-V_T$] volts; where $V_T$ is assumed to be the threshold voltage of N4 and the threshold voltage of the other transistors in the circuit. Since N4 conducts in the source follower mode, it has significant current gain and can supply a relatively large current into output node 2 to drive node 2 to [$V_{CC}-V_T$] volts very quickly, even though N2 may still be partially ON and/or the capacitance at node 2 is substantial.

The sharp positive rise in potential at node 2, due to conduction by N4, causes a decrease in the gate-to-source potential of P1. Hence, the conductivity of P1 is being decreased (i.e. its impedance is increased) as a result of coupling the positive going $\overline{A}$ signal via N4 to the gate of P1. The decrease in the conductivity of P1 enables N1 to discharge node 1 to ground faster and more sharply. This, in turn, accelerates the turn-ON of P2, which, in turn, accelerates the pull-up of node 2 to, or close to, $V_{DD}$ and the prompt full turn-OFF of P1.

As P2 turns-ON, it couples $V_{DD}$ volts to node 2. Where $V_{DD}$ is greater than $V_{CC}$, a point is reached when the potential at node 2 exceeds [$V_{CC}-V_T$] volts. When that occurs, N4 turns-OFF. This is not a problem since N4 has already caused a sharp rise in the potential at node 2. When the potential at node 2 rises above $V_{CC}-V_T$, P1 is being turned OFF and its impedance is substantially greater than that of N1 and P2 is being turned-ON harder. Hence, full regenerative action has set in and node 2 is being driven quickly to $V_{DD}$ via P2 and P1 is being turned-OFF-quickly, enabling node 1 to be driven quickly to ground via N1.

Following the signal transition at nodes 1 and 2, one node (e.g. node 2) will be at, or close to, $V_{DD}$ volts and the other node (e.g. node 1) will be at, or close to, zero volts. For this signal condition, one of N3 and N4 (e.g. N3) has its source and gate at zero volts and is OFF. The other one of N3 and N4 (e.g. N4) has its source/drain electrode at $V_{DD}$ volts, its drain/source electrode at $V_{CC}$ volts and its gate electrode at $V_{CC}$ volts, and is therefore also non-conducting. Hence, in the steady state condition, N3 and N4 are non-conducting and do not dissipate any power.

For the complementary transition condition to the one just discussed, the same operation described above occurs with the roles of inverting means I1 and I2 being interchanged. Therefore, this condition need not be detailed.

It has thus been shown that, in circuits embodying the invention, the potential at an output node (1 or 2) makes a transition from the high level to the low level and from the low level to the high level in less time than in the prior art circuit of FIG. 1. The faster drop of the falling output ($\overline{Q}$ or Q) causes a faster turn-ON of one of the load transistors (P1 or P2) and the faster application of a turn-OFF potential to the other one of the laod transistors. Therefore, the period of time when transistors (e.g P1, P2, N1 and N2) are simultaneously turned-ON is greatly decreased. The circuit of the invention also permits more leeway in the "ratioing" of the impedances of the transistors N1, N2, P1 and P2 forming the basic level shift circuit. Although the circuit of FIG. 2 was primarily designed for use as a level shifter with $V_{CC}$ less than $V_{DD}$, the circuit operates with $V_{CC}$ equal to $V_{DD}$ and even where $V_{CC}$ is slightly greater than $V_{DD}$.

Figure 3:
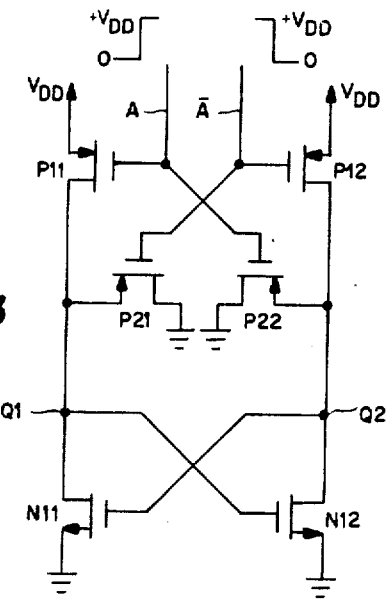
FIG. 3 is a schematic diagram of another level shift circuit embodying the invention.

The circuit of FIG. 3 is like that of FIG. 2, except that the switching transistors P11 and P12 and the source follower transistor P21 and P22 are of P-conductivity type and the cross-coupled load transistors N11 and N12 are of N-conductivity type. In the configuration of FIG. 3, when A is low, and $\overline{A}$ is high, transistors P11 and P22 are turned-ON and P12 and P21 are turned-OFF. When A goes from low-to-high, $\overline{A}$ goes from high-to-low. P12 is turned-ON and drives node Q2 to $V_{DD}$ volts while the turn-ON of P21, conducting in the source follower mode, aids in the quick discharge of node Q1 toward ground potential. For the complementary condition (A going low and $\overline{A}$ going high), P11 and P22 are turned-ON and P12 and P21 are turned-OFF. The turn-ON of P11 drives node Q1 to $V_{DD}$ while the turn-ON of P22 conducting in the source follower mode aids in the quick discharge of node 02 toward ground potential. Cross-coupled transistor N11 and N12 function in a similar, though complementary, fashion to transistors P1 and P2 in FIG. 2. Accordingly, the transient response of the circuit need not be further detailed.

What is claimed is:

1. The combination comprising:
   first and second power terminals for the application therebetween of an operating potential;
   first and second input terminals for the application thereto of complementary input signals;
   first and second outputs at which are produced complementary output signals in response to said input signals;
   first and second switching transistors, each having a conduction path and a control electrode;
   means connecting the conduction paths of said first and second transistors between said first and second outputs, respectively, and said first power terminal;
   means connecting the control electrodes of said first and second transistors to said first and second input terminals, respectively;
   first and second variable impedance means connected between said first and second outputs, respectively, and said second power terminal;
   third and fourth transistors of same conductivity type as said first and second switching transistors, said third and fourth transistors having source and drain electrodes defining the ends of a conduction path and a control electrode;
   means connecting the source electrode of said third transistor to said first output and its control electrode to said second input terminal;
   means connecting the source electrode of said fourth transistor to said second output and its control electrode to said first input terminal; and
   means connecting the drain electrodes of said third and fourth transistors to a point of operating potential for operating said third and fourth transistors in the source follower mode and for passing a current between said point of operating potential and said first output, in addition to, and of same polarity as, the current flowing through said first variable impedance means, when said third transistor is rendered conductive, and for passing a current between said point of operating potential and said second output, in addition to, and of same polarity as, the current through said second variable impedance means when said fourth transistor is rendered conductive.

2. The combination as claimed in claim 1 wherein said first and second variable impedance means are, respectively, fifth and sixth transistors of complementary conductivity type to the conductivity of said first through fourth transistors, said fifth and sixth transistors having a conduction path and a control electrode;
   wherein the conduction path of said fifth transistor is connected between said first output and said second power terminal and its control electrode is connected to said second output; and
   wherein the conduction path of said sixth transistor is connected between said second output and said second power terminal and its control electrode is connected to said first output.

3. The combination as claimed in claim 2 wherein said transistors are insulated-gate field-effect transistors (IGFETs).

4. The combination as claimed in claim 2 wherein a first voltage supply is applied to said first power terminal, a second voltage supply is applied to said second power terminal, and wherein said means connecting the drain electrodes of said third and fourth transistors to a point of operating potential include means for applying a voltage to said drains of said third and fourth transistors intermediate said first and second voltages.

5. A level shift circuit comprising:
   first and second inverting means, each inverting means having an input and an output and including a switching transistor of one conductivity type connected between its inverter output and a first point of operating potential and a load transistor of complementary conductivity type connected between its inverter output and a second point of operating potential, each transistor having a conduction path and a control electrode and each inverting means having a signal input and a signal output;
   means connecting the control electrode of each switching transistor to the signal input of its inverting means;
   means connecting the contol electrode of the laod transistor of the first inverting means to the signal output of the second inverting means and means connecting the control electrode of the load transistor of the second inverting means to the signal output of the first inverting means;
   means for applying complementary signals to the control electrodes of the switching transistors of the first and second inverting means;
   first and second source followers, each source follower having an input and an output;
   means connecting the input of said first source follower to the input of said second inverting means and the output of said first source follower to the output of said first inverting means for providing a current path, in addition to that of the load transistor connected to said output of said first inverting means, for rapidly initiating the charging of said output of said first inverting means towards said second point of operating potential; and
   means connecting the input of said second source follower to the input of said first inverting means and the output of said second source follower to the output of said second inverting means for providing a current path, in addition to that of the load transistor connected to said output of said second inverting means, for rapidly initiating the charging of said output of said second inverting means towards said second point of operating potential.

6. The combination as claimed in claim 5 wherein each one of said first and second source followers includes a source follower transistor of same conductivity type as said switching transistors, each source follower transistor having source and drain electrodes defining the ends of a conduction path and a control electrode; and
   wherein the control electrode of the source follower transistor defines the input of the source follower and the source electrode of the source follower transistor defines the output of the source follower.

7. The combination as claimed in claim 6 wherein the switching transistor of each inverting means has its conduction path connected between the signal output of its inverter and a point of fixed operating potential.

8. The combination comprising:

first and second power terminals for the application therebetween of an operating potential;

first and second input terminals for the application thereto of complementary input signals;

first and second outputs at which are produced complementary output signals in response to said input signals;

first and second switching transistors, first and second load transistors, and first and second source follower transistors, each transistor having a conduction path and a control electrode;

means direct current connecting the conduction paths of said first and second transistors between said first and second outputs, respectively, and said first power terminal;

means direct current connecting the control electrodes of said first and second transistors to said first and second input terminals, respectively;

means connecting the conduction path of said first and second load transistors between said first and second outputs, respectively, and said second power terminal;

means direct current connecting one end of the conduction path of said first source follower transistor to said first output, and means direct current connecting one end of the conduction path of said second source follower to said second output;

means connecting the other end of the conduction paths of said first and second source follower transistors to a point of operating potential; and means for applying a turn-on signal to the control electrode of said first source follower transistor when said first switching transistor is being turned-off, and for applying a turn-on signal to the control electrode of said second source follower transistor when said second switcing transistor is being turned-off for causing additional current flow and rapidly charging the output node to which each source follower transistor is connected, when that source follower transistor is turned-on.

9. The combination as claimed in claim 8 wherein the control electrode of said first load transistor is connected to said second output and the control electrode of said second load transistor is connected to said first output.

* * * * *

UNITED STATES PATENT AND TRADEMARK OFFICE
CERTIFICATE OF CORRECTION

PATENT NO. : 4,695,744

DATED : Sep. 22, 1987

INVENTOR(S) : Raymond L. Giordano

It is certified that error appears in the above-identified patent and that said Letters Patent is hereby corrected as shown below:

Col. 1, line 40, after "volts" insert --and the drains of transistors N1 and N2, respectively--.

Col. 2, line 19, delete "go" and insert --to--.

Col. 2, line 41, after "N2" delete "." and insert --,--.

Col. 2, line 46, delete "lode" and insert --load--.

Col. 2, line 65, delete "13" and insert --I3--.

Col. 3, line 1, delete "13" and insert --I3--.

Col. 3, line 3, delete "13" and insert --I3--.

Col. 3, line 6, after "ground" insert --and--.

Col. 3, line 23, delete "Q" and insert --$\overline{Q}$--.

Col. 6, line 31, delete "laod" and insert --load--.

Col. 7, line 26, delete "path" and insert --paths--.

Signed and Sealed this

Twenty-eighth Day of June, 1988

Attest:

DONALD J. QUIGG

Attesting Officer      Commissioner of Patents and Trademarks